CONVERSION OF AMPLITUDE TO PHASE MODULATION
BY MEANS OF CRYSTAL TO REDUCE NOISE

Filed Nov. 4, 1957 2 Sheets-Sheet 1

Paul L. Schaffer
INVENTOR.

BY Clarence A. O'Brien
and Harvey B. Jacobson
Attorneys

June 7, 1960 P. L. SCHAFFER 2,939,951

CONVERSION OF AMPLITUDE TO PHASE MODULATION BY MEANS OF CRYSTAL TO REDUCE NOISE

Filed Nov. 4, 1957 2 Sheets-Sheet 2

Paul L. Schaffer
INVENTOR.

BY Clarence A. O'Brien and Harvey B. Jacobson
Attorneys 2,939,951

CONVERSION OF AMPLITUDE TO PHASE MODULATION BY MEANS OF CRYSTAL TO REDUCE NOISE

Paul L. Schaffer, Falls Road, West Falls, N.Y.

Filed Nov. 4, 1957, Ser. No. 694,179

3 Claims. (Cl. 250—20)

This invention relates generally to novel amplitude modulation radio receiver circuits.

The novelty of this invention lies in the circuitry and method of reception of amplitude modulated waves which utilize a principle heretofore unknown in radio receivers. The principle is that of transforming an amplitude modulated signal to a phase modulated signal by shifting the side bands 90° in phase with respect to the carrier. Though it has long been known that one of the principal ways to obtain phase modulated waves is by shifting the side bands relative to the carrier, the principle has never been used in the reception of radio waves, previously being utilized only in the transmission of phase modulated signals. The specific novelty of the invention lies therefore in the utilization of a transmission principle applied to reception resulting in a vastly improved radio receiver circuit.

Numerous methods are known and used to create a phase shift between the side bands and carrier of an amplitude modulated wave. One method utilizes slope tuning which is the practice of placing the carrier on the slope of the curve of a resonant circuit having the proper Q. A second method used is to place the carrier in the spike or peak of a sharp, off neutralized piezoelectric crystal filter. A third method includes the utilization of the common F.M. discriminator. In the invention here under consideration, the A.M. signal coming from a radio station is picked up and introduced into a dual conversion super heterodyne receiver. After passing through the initial radio frequency stage including the amplifier and detector, the amplitude modulated wave is heterodyned to an intermediate frequency and is then subjected to a crystal filter in such a manner that the carrier is placed in the peak portion of the crystal response curve. The crystal acts on the wave to shift the side bands 90° with respect to the carrier and therefore in effect to convert the amplitude modulated wave to a phase modulated wave. As a phase modulated wave, it can be subjected to amplitude limiters or frequency multipliers to suppress undesired noise. The signal is then returned to its amplitude modulated form by a second passage through a crystal filter or by passing through a resonant circuit on the sloped side of the curve, or by being passed through an F.M. discriminator. In amplitude modulated form the signal is detected and sent to an audio-frequency amplifier and then to the speaker.

In the three embodiments of the invention herein disclosed, a piezoelectric crystal filter is used because of its simplicity, stability, exalted carrier effect, and efficient rejection of one side band and interfering heterodynes to give single side band reception. This shifting of the side bands allows the amplitude modulated wave to be treated as a phase modulated wave so that it can be passed through a suitable amplitude limiting circuit operating at very low plate and screen voltages to greatly reduce amplitude modulation effects and noise and disturbances of an amplitude nature. This degree of limiting would be impractical in a conventional amplitude modulation receiver as the suppression of the carrier would produce over-modulation and distortion. In this receiver the quality of reproduction exceeds that of previously known amplitude modulation receivers.

The principal object of this invention therefore is to provide a new type of amplitude modulation radio receiver which is capable of giving high fidelity reproduction of broadcast signals along with good noise reduction.

It is a further object of this invention to provide a radio receiver which responds equally well to all frequencies throughout the broadcast range.

It is a still further object of this invention to provide a radio receiver having a high degree of selectivity without the ringing or boomy production often found in prior radio receivers.

It is a still further object of this invention to provide a radio receiver having a sensitivity surpassing that of conventional amplitude modulated receivers. This being true because of the fact that the amplitude limiter tubes become saturated with signals of low intensity from which it follows that the receiver is capable of using a very high degree of amplification.

It is a still further object of this invention to provide an amplitude modulation receiver having a lower noise level than previous receivers. This being due to the amplitude limiting stages which if used in conventional receivers would seriously distort reception. It is a still further object of this invention to provide an amplitude modulation radio receiver which automatically suppresses interfering heterodynes in side bands. This is accomplished by the accurate placing of the carrier wave within the peak of the crystal filter.

These together with other objects and advantages which will become subsequently apparent reside in the details of construction and operation as more fully hereinafter described and claimed, reference being had to the accompanying drawings forming a part hereof, wherein like numerals refer to like parts throughout, and in which:

Figure 1:
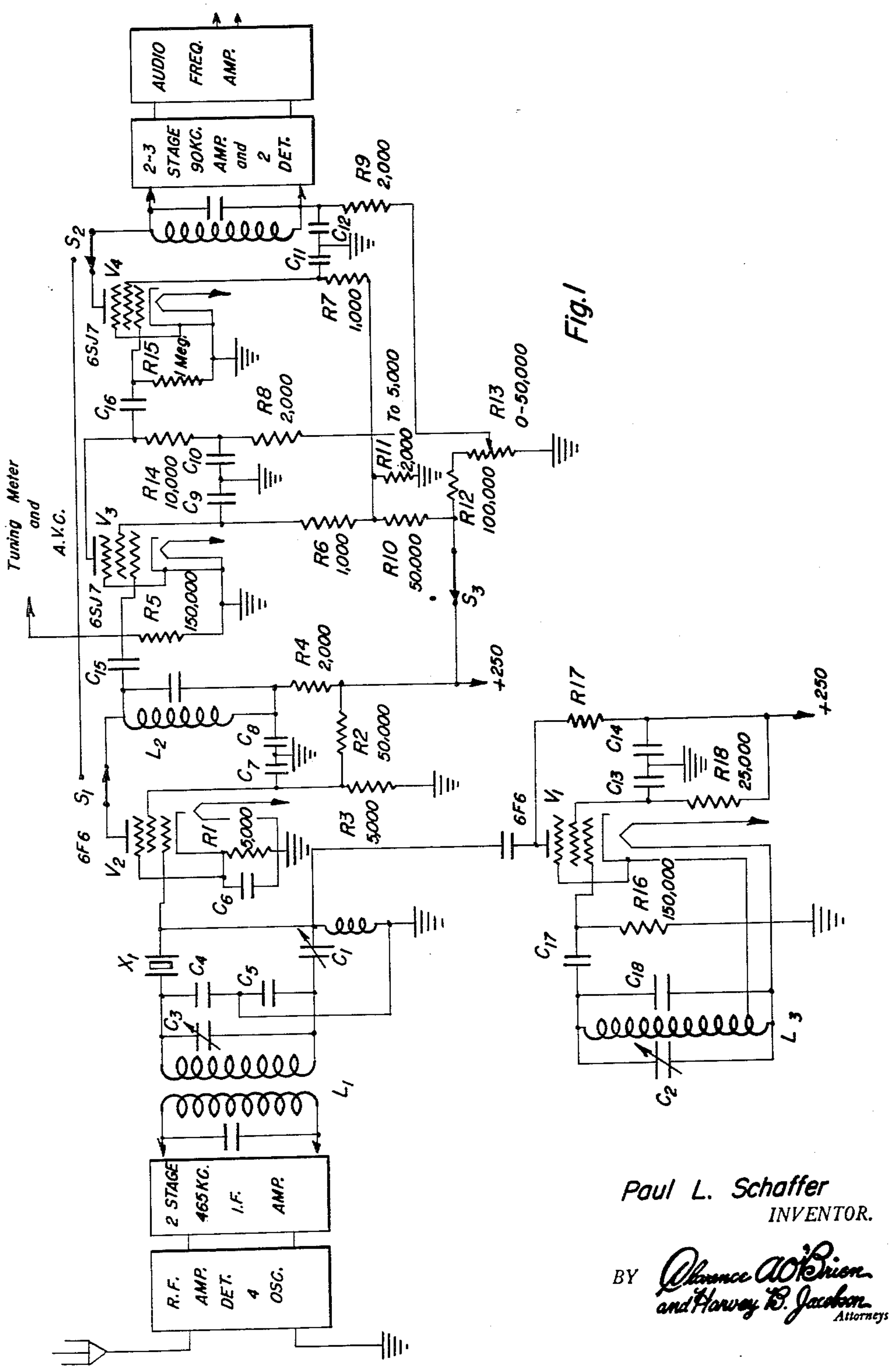
Figure 1 shows the basic embodiment of this invention utilizing a dual conversion super heterodyne circuit and including side band shifting means and amplitude limiter means.

Referring now to Figure 1, a dual conversion super heterodyne circuit is shown having an antenna input to a radio frequency amplifier to the first detector. The radio frequency signal is then heterodyned by a coupled oscillator to a lower intermediate frequency shown in the figure to be 465 kilocycles. The intermediate frequency signal is fed through a two stage intermediate frequency amplifier and is inductively coupled through transformer $L_1$ to a sharp, off neutralized piezoelectric crystal filter and its associated circuit. Oscillator $V_1$, oscillating nominally at 555 kilocycles is beat with the 465 kilocycle signal in mixer $V_2$. The combination of the signal passage through the crystal and the heterodyning results in a phase modulated signal of 90 kilocycles being produced at $L_2$. From $L_2$ the signal can be passed directly to the slope of the 90 kilocycle amplifier to produce the 90° phase shift necessary before demodulation or the signal may be passed through the cascade limiters $V_3$, $V_4$ and then to the 90 kilocycle amplifier for noise reduction. It would appear that because the degree of limiting as used here clips off or maintains at a constant level the amplitude of all side band components and interfering signals plus noise impulses that we would encounter very broad tuning. Amplitude limiters of this type, however, when driven to the saturation point have a tendency to accept the strongest carrier and suppress all others. This suppression is also true of noise disturbances when the desired signal is appreciably stronger than the noise. By having inserted the carrier of the desired signal in the spike of the crystal filter its amplitude is above that of any other signal except in rare cases. Because of this effect the selectivity remains practically the same with the limiters in or out of the circuit.

Switches, $S_1$, $S_2$, $S_3$, are shown to cut-out the limiters when not desired as the interchannel noise level is high due to the extreme sensitivity as the amplification provided by the radio frequency amplifier and intermediate frequency amplifier should be sufficient to saturate the limiters with signals of low intensity. The "on" signal noise level however, is much lower than in conventional amplitude modulation receivers. Even without the limiters in the circuit, considerable increase in signal to noise ratio and selectivity is attained in this receiver due to the fact that it is not necessary to provide a band width across the nose or peak of the selectivity curve of the 90 kilocycle amplifier to accommodate the side band frequencies required for undistorted reproduction as is true in conventional amplitude modulation receivers.

Subsequent to the limiters, the signal is fed to the 90 kilocycle amplifier wherein the circuits are of high Q and are loosely coupled to provide steep curves and a narrow peak. The carrier is placed on either curve just below the peak and the frequencies of desired side band fall on the steep slope of the curve. Thus any interfering signals or noise impulses within the narrow band pass will be down in amplitude or below the peak of the curve. It is further pointed out here that with the degree of selectivity as provided by the 90 kilocycle amplifier, reception would be distorted if the signal was not originally shifted in phase in the crystal filter. An amplitude modulated signal placed in this amplifier gives practically all base reproduction with the serious attenuation of all high frequencies. The signal from the crystal filter gives natural reproduction and with the limiters in the circuit accentuates the high audio frequencies. Upon emerging from the 90 kilocycle amplifier, the signal is passed through an ordinary amplitude modulation detector and thence to an audio frequency amplifier which sends it to the speaker.

In operation, the front end of the circuit or radio frequency amplifier, first detector and high frequency oscillator are tuned to the desired signal to insert the carrier of the signal after conversion to 465 kilocycles in the spike of the crystal filter as registered by maximum indication of the tuning meter. A variable capacitor $C_2$ of the low frequency oscillator $V_1$ is adjusted to place the spike of crystal filter X on either slope of the 90 kilocycle amplifier. $C_1$ the phasing control of the crystal is adjusted to accept the desired or readable side band and reject the other (off-neutralized position). If interference is encountered on this side band $C_2$ can shift the crystal peak to the other slope of the 90 kilocycle amplifier and $C_1$ is readjusted accordingly. The proper position of $C_2$ is easily found as at resonance (when the spike of the crystal is in the peak of the 90 kilocycle amplifier) the quality of reproduction is drummy and distorted, accompanied by a null or decrease in audio output. This situation is similar to the one occurring whenever a phase modulation signal is received on a conventional amplitude modulation receiver. When the spike is placed in the proper position on either slope of the 90 kilocycle amplifier, reception is exceptionally clear with no boomy reproduction as occurs in conventional amplitude modulation receivers. It is important that the low frequency oscillator $V_1$ and the high frequency oscillator in the radio frequency section are very stable because of the high selectivity of the sharp crystal filter.

It is to be noted that switches $S_1$, $S_2$, $S_3$ are ganged and when all are actuated the passing signal bypasses the amplitude limiters. Furthermore, the connection to the tuning meter should be noted. This connection further serves to feed an automatic volume control circuit if such a circuit is desired to be included.

It is pointed out that the various elements and values specified in Figure 1 can be altered considerably with no serious effects on the results. This of course depends upon the circuit design and the difference in components used. For instance, any good sharp off-neutralized crystal filter will be suitable. The values of resistors and condensors as shown are not critical and can vary considerably.

Tube $V_2$ and the accompanying circuitry can be operated at a lower signal level and a broad band 90 kilocycle amplifier stage can be inserted between it and the input of the 90 kilocycle amplifier. However, it should be noted that no sharp or selective circuits or networks can be used between the crystal filter and the input of the 90 kilocycle amplifier. $L_2$ is loaded sufficiently by resistor $R_5$ to give a broad response.

If desired, two oscillators can be used in place of the single oscillator $V_1$ shown. Of the two oscillators, one would be 90 kilocycles above the intermediate frequency of 465 kilocycles and one 90 kilocycles below the intermediate frequency. In this case, it would be necessary to only work one slope of the selectivity curve of the 90 kilocycle amplifier, as either the upper or lower side band of the 465 kilocycle intermediate wave can be transposed here. The 90 kilocycle amplifier can then include a high Q rejection circuit or circuits to eliminate the one unused slope. This arrangement, in conjunction with the phasing control $C_2$ will give absolute rejection of the undesired side band.

Figure 2:
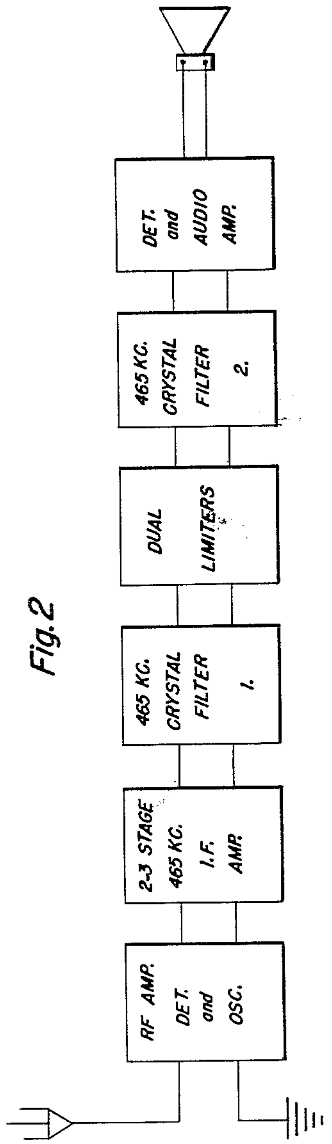
Figure 2 shows a block diagram of another embodiment of the invention utilizing crystal filters in two stages.

The circuit of Figure 2 shows another arrangement of the invention utilizing the same principles as the circuit described above. The initial stages are identical to the embodiment of Figure 1 and the circuit of Figure 2 only deviates in that instead of using a 90 kilocycle amplifier, the embodiment of Figure 2 uses a second crystal filter stage to reshift the side bands with respect to the carrier. This action retransforms the phase modulated signal at this point in the circuit to an amplitude modulated signal so that it may proceed to the amplitude modulation detector and then to the audio amplifier to the speaker. This second circuit has the advantage of dual rejection controls (rejection in each crystal filter). Thus two interfering heterodynes on the same side band can be rejected. It further has the advantage of exalted carrier effect of the second crystal filter which exalts the carrier of the signal after limiting. A lower intermediate frequency amplifier capable of passing both side bands and crystal filters of this same frequency can be used for increased selectivity.

Either circuit (Figs. 1 and 2) can be operated on the second harmonic for increased deviation and audio recovery. In Figure 1 oscillator $V_1$ can be resonated at 510 kilocycles to produce a beat frequency of 45 kilocycles in $V_2$ and $L_2$. The two stage limiter will then act as a limiter and a frequency doubler passing a 90 kilocycle signal to the 90 kilocycle amplifier. It is to be noted in Figure 2, that no intermediate frequency oscillator such as $V_1$ need be used. It is only necessary to have the frequency of the second crystal filter equal to the frequency of the first crystal filter or if the circuit is being operated on the second harmonic, the second crystal filter should have a frequency equal to the second harmonic of the frequency of the first crystal filter.

Figure 3:
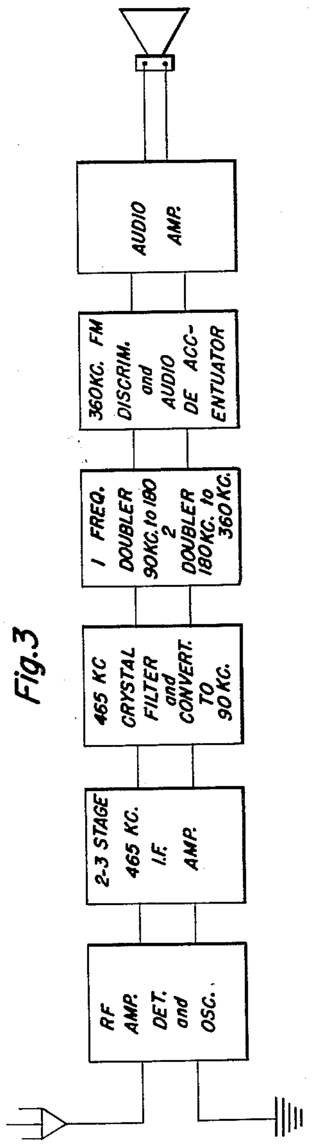
Figure 3 is a block diagram showing a further embodiment utilizing the principles of this invention and being characterized by its single crystal filter stage along with frequency multipliers and common F.M. discriminator.

Figure 3 shows a further embodiment of the invention in which it can be seen that the initial stages are identical to the stages utilized in Figures 1 and 2. However, in the place of the amplitude limiters of Figure 1, frequency multipliers are used which feed an F.M. discriminator which in turn acts to shift the side bands with respect to the carrier as is done by the tuned circuit of Figure 1 and the second crystal filter of Figure 2. As is designated by the block diagrams, the fourth harmonic of the crystal frequency is fed to the input on the F.M. discriminator. This frequency multiplication is necessary to obtain the proper frequency deviation to activate the frequency discriminator. Deaccentuation of the high audio frequencies is used between the output of the discriminator and the input of the first audio frequency amplifier to give uniform response to the audio frequencies. The practice of using an audio deaccentuator following an F.M. discriminator is customary in the demodulation of phase modulated signals with F.M. discriminators.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be resorted to, falling within the scope of the invention as claimed.

What is claimed as new is as follows:

1. An amplitude modulation radio receiver for receiving waves having a carrier and a pair of side bands comprising first means for beating an amplitude modulated wave of radio frquency into a signal of intermediate frequency, an off neutralized crystal filter electrically connected to said first means for shifting the side bands 90° relative to said carrier to effectively convert said amplitude modulated wave into a phase modulated wave, an oscillator, a mixer, said oscillator and said mixer electrically connected to said crystal filter for further beating said wave, a narrow band pass amplifier electrically connected to the output of said mixer, means connected to said oscillator for varying the frequencies of said oscillator whereby said carrier may be properly placed in said narrow band.

2. An amplitude modulation radio receiver for receiving waves having a carrier and a pair of side bands comprising first means for beating an amplitude modulated wave of radio frequency into a signal of intermediate frequency, an off neutralized crystal filter electrically connected to said first means for shifting the side bands 90° relative to said carrier to effectively convert said amplitude modulated wave into a phase modulated wave, an oscillator, a mixer, said oscillator and said mixer electrically connected to said crystal filter for further beating said wave, a narrow band pass amplifier electrically connected to the output of said mixer, tuning means connected to said oscillator for varying the frequency thereof so as to place the carrier in the narrow band just below the band peak whereby the frequencies of the desired sideband fall on the steep slope of the band pass curve, and amplitude modulation detector means electrically connected to the output of said amplifier.

3. The combination of claim 1 wherein amplitude limiter means are electrically interposed between said crystal filter and said amplifier.

References Cited in the file of this patent

UNITED STATES PATENTS

| | | |
|---|---|---|
| 2,085,008 | Crosby | June 29, 1937 |
| 2,170,202 | Kupfmuler | Aug. 22, 1939 |
| 2,173,156 | Beverage | Sept. 19, 1939 |
| 2,713,118 | Hart | July 12, 1955 |